United States Patent
Park et al.

(10) Patent No.: US 10,007,124 B2
(45) Date of Patent: Jun. 26, 2018

(54) MASTER WAFER, METHOD OF MANUFACTURING THE SAME, AND METHOD OF MANUFACTURING OPTICAL DEVICE BY USING THE SAME

(71) Applicant: Samsung Electronics Co., Ltd., Suwon-si, Gyeonggi-do (KR)

(72) Inventors: Joonyong Park, Suwon-si (KR); Dongouk Kim, Pyeongtaek-si (KR); Jihyun Bae, Seoul (KR); Bongsu Shin, Seoul (KR); Jong G. Ok, Seoul (KR); Ilsun Yoon, Seongnam-si (KR); Sunghoon Lee, Seoul (KR); Jaeseung Chung, Suwon-si (KR); Sukgyu Hahm, Gyeongju-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 385 days.

(21) Appl. No.: 14/838,507

(22) Filed: Aug. 28, 2015

(65) Prior Publication Data
US 2016/0062132 A1  Mar. 3, 2016

(30) Foreign Application Priority Data
Sep. 1, 2014  (KR) ........................ 10-2014-0115683

(51) Int. Cl.
| | |
|---|---|
| *H01L 21/311* | (2006.01) |
| *H01L 21/3065* | (2006.01) |
| *G02B 27/62* | (2006.01) |
| *G02B 5/30* | (2006.01) |
| *G02F 1/1333* | (2006.01) |

(52) U.S. Cl.
CPC .......... *G02B 27/62* (2013.01); *G02B 5/3058* (2013.01); *G02F 1/13336* (2013.01)

(58) Field of Classification Search
None
See application file for complete search history.

(56) References Cited

U.S. PATENT DOCUMENTS

| | | | | |
|---|---|---|---|---|
| 2007/0190691 A1* | 8/2007 | Humpston | .......... | B81C 1/00269 438/113 |
| 2008/0233404 A1* | 9/2008 | Wolk | .................... | B29C 59/022 428/411.1 |
| 2009/0110878 A1* | 4/2009 | Pratt | ....................... | G03F 9/708 428/137 |
| 2009/0284837 A1* | 11/2009 | Lake | ................ | B29D 11/00365 359/619 |
| 2010/0170086 A1* | 7/2010 | Ramadan | ............ | H01L 21/6835 29/834 |
| 2010/0290123 A1* | 11/2010 | Yamada | ................ | B29C 43/021 359/619 |

(Continued)

FOREIGN PATENT DOCUMENTS

| | | |
|---|---|---|
| JP | 2002-353120 A | 12/2002 |
| JP | 2005-340321 A | 12/2005 |

(Continued)

*Primary Examiner* — Shamim Ahmed
(74) *Attorney, Agent, or Firm* — Cantor Colburn LLP

(57) ABSTRACT

A master wafer includes: a plurality of unit wafers each including a pattern disposed thereon; a coupling surface defined on each of the unit wafers; and a coupling part which couples adjacent unit wafers among the plurality of unit wafers on which the coupling surface is defined, to each other.

16 Claims, 12 Drawing Sheets

(56) References Cited

U.S. PATENT DOCUMENTS

2011/0272788 A1* 11/2011 Kim .................. H01L 25/0657
257/618
2014/0093692 A1 4/2014 Miyazawa et al.

FOREIGN PATENT DOCUMENTS

JP 2007-053255 A 3/2007
JP 4036602 B1 11/2007

* cited by examiner ing Korean Patent Application No. 10-2014-0115683, filed on Sep. 1, 2014, and all the benefits accruing therefrom under 35 U.S.C. § 119, the disclosure of which is incorporated herein in its entirety by reference.

BACKGROUND

1. Field

Provided is a master wafer that may be manufactured to have a relatively large planar area, a method of manufacturing the master wafer, and a method of manufacturing an optical device by using the master wafer.

2. Description of the Related Art

In many applications, light emitted from a light source is easily controlled based on the polarization characteristics of light. For example, in a liquid crystal display device including a liquid crystal display panel, the liquid crystal display panel functions as a shutter which blocks or transmits light by varying the polarization direction of linearly polarized light through the use of liquid crystal molecules disposed therein.

In a liquid crystal display device, a liquid crystal display panel may include a plurality of pixels, first and second polarizing plates having polarization directions perpendicular to each other, a liquid crystal layer between the first and second polarizing plates, and a thin film transistor ("TFT") in each pixel. A voltage for each pixel is turned on or off according to the switching operation of the TFT. For example, if a voltage for a pixel is turned on, liquid crystal molecules of the liquid crystal layer are aligned along a line, and incident light passes through the liquid crystal layer without a change in the polarization direction thereof. Then, the light is blocked by the second polarizing plate. If a voltage for a pixel is turned off, the liquid crystal molecules of the liquid crystal layer are arranged in a twisted manner, and incident light passes through the liquid crystal layer while the polarization direction thereof changes according to the arrangement of the liquid crystal molecules. Then, the light passes through the second polarizing plate. That is, if liquid crystal molecules are in a twisted state, a pixel displays white, and if liquid crystal molecules are not in a twisted state, the pixel displays black.

SUMMARY

Since the optical efficiency of a polarizing plate is low, a liquid crystal display panel using a polarizing plate has a low degree of optical efficiency. In the liquid crystal display panel, a reflective polarizing plate may be used instead of an absorptive polarizing plate to improve the optical efficiency thereof.

As display devices increase in size, relatively large dimension reflective polarizing plates may be used within relatively large dimension liquid crystal display panels of such display devices. However, as the size of master wafers used to form these reflective polarizing plates is limited, manufacturing of the relatively large dimension reflective polarizing plates may be difficult.

Provided is a relatively large planar area master wafer.

Provided is a method of manufacturing a relatively large planar area master wafer.

Provided is a method of manufacturing an optical device using a relatively large planar area master wafer.

Additional features will be set forth in part in the description which follows and, in part, will be apparent from the description, or may be learned by practice of the presented embodiments.

According to an embodiment, a relatively large planar area master wafer includes: a plurality of unit wafers each including a pattern disposed thereon; a coupling surface defined on each of the unit wafers; and a coupling part which couples adjacent unit wafers among the plurality of unit wafers on which the coupling surface is defined, to each other.

Each of the unit wafers on which the coupling surface is defined may include an alignment mark.

The coupling surface may have a roughness of about 5 micrometers (μm) or less.

The coupling part may include a photocurable resin or a thermosetting resin.

According to another embodiment, a method of manufacturing a master wafer includes: providing a pattern respectively on a plurality of unit wafers; removing from each of the plurality of unit wafers on which the pattern is provided, a portion thereof excluding the pattern, to form a coupling surface of each of the unit wafers on which the pattern is provided; aligning the unit wafers for which is formed the coupling surface, such that the coupling surfaces of the unit wafers face each other; and coupling the unit wafers for which the coupling surfaces face each other, to each other at the facing coupling surfaces.

The method may further include disposing at least one alignment mark on each of the unit wafers on which the pattern is provided.

The removing the unit wafer portion excluding the pattern may be performed by one of a deep reactive ion etching method, a stealth dicing method and a wet etching method.

The deep reactive ion etching method may include a BOSCH method.

The coupling the unit wafers may include: reducing a distance between facing coupling surfaces of adjacent unit wafers; disposing a photocurable resin or a thermosetting resin between the facing coupling surfaces of the adjacent unit wafers; and hardening the photocurable resin or the thermosetting resin between the facing coupling surfaces of the adjacent unit wafers.

The aligning the unit wafers may include, within a plane in which the unit wafers are disposed, linearly moving or tilting the unit wafers by using an actuator.

The actuator may include a plurality of piezoelectric actuators.

The aligning the unit wafers may include: disposing coating layers on a plurality of stages upon which the unit wafers to be aligned are disposed, the coating layers including a material having low surface energy; and respectively placing the unit wafers to be aligned, on the coating layers disposed on the plurality of stages, such that the patterns of the unit wafers to be aligned face the coating layers.

The coating layers may include polymerized tetrafluoroethylene such as Teflon®.

The method may further include polishing the unit wafers on which the pattern is provided to reduce a thickness difference therebetween.

The method may further include disposing a plurality of alignment marks on each of the unit wafers on which the pattern is provided. The removing the unit wafer portion excluding the pattern may include leaving at least two alignment marks on each of the unit wafers on which the pattern is provided. The aligning the unit wafers may include aligning the least two alignment marks left on each of the unit wafers with each other.

According to another embodiment, a method of manufacturing an optical device includes: providing a pattern respectively on a plurality of unit wafers; removing from the plurality of unit wafers on which the pattern is provided, a portion thereof excluding the pattern, to form a coupling surface of each of the unit wafers on which the pattern is provided; aligning the unit wafers for which is formed the coupling surface, such that the coupling surfaces of the unit wafers face each other; coupling the unit wafers for which the coupling surfaces face each other, to each other at the facing coupling surfaces, to form a master wafer including a master wafer pattern corresponding to the patterns of the coupled unit wafers; disposing a first resin layer on the master wafer including the master wafer pattern; disposing a stamp film on the first resin layer disposed on the master wafer to transfer the master wafer pattern onto the first resin layer and form on the stamp film, a patterned first resin layer corresponding to the master wafer pattern; separating the stamp film and the patterned first resin layer thereon from the master wafer including the master wafer pattern; disposing a second resin layer on a substrate separate from the master wafer; and placing the stamp film and the patterned first resin layer thereon on the second resin layer disposed on the substrate, to transfer the patterns of the coupled unit wafers onto the second resin layer.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
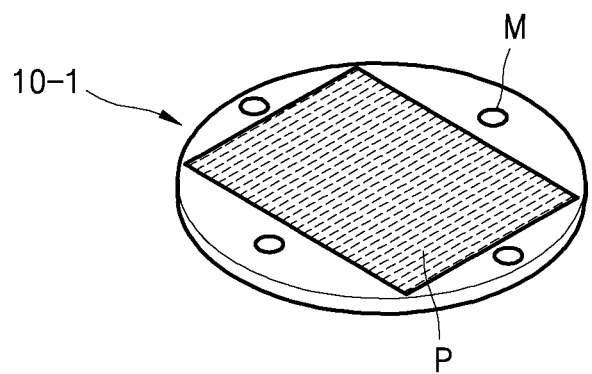
FIG. 1 is a perspective view illustrating a unit wafer of a relatively large planar area master wafer according to an embodiment.

Reference will now be made in detail to embodiments, examples of which are illustrated in the accompanying drawings. As used herein, the term "and/or" includes any and all combinations of one or more of the associated listed items. Expressions such as "at least one of," when preceding a list of elements, modify the entire list of elements and do not modify the individual elements of the list.

In the drawings, like reference numbers refer to like elements, and also the size of each element may be exaggerated for clarity of illustration. The embodiments described herein are for illustrative purposes only, and various modifications may be made therefrom. In the following description, when a layer is referred to as being "above" or "on" another layer or substrate, it may be directly on the other layer or substrate, or intervening layers or may also be present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a relatively large planar area master wafer, a method of manufacturing the relatively large planar area master wafer, and a method of manufacturing an optical device using the relatively large master area master wafer will be described in detail with reference to the accompanying drawings.

FIGS. 1 to 5 are perspective views illustrating a method of manufacturing a relatively large planar area master wafer according to an embodiment.

Referring to FIG. 1, a unit wafer 10-1 on which a pattern P is disposed may be prepared. In an embodiment, for example, the unit wafer 10-1 may be a silicon wafer. However, the unit wafer 10-1 is not limited thereto. In an embodiment, for example, the unit wafer 10-1 may be a silicon-containing wafer. As described above, the pattern P is disposed on the unit wafer 10-1, and may be formed on the unit wafer 10-1.

In an embodiment, for example, the pattern P may include a micro-sized line. In an embodiment, for example, the micro-sized line may have a width smaller than about 1000 micrometers (μm). In an embodiment, for example, the pattern P may include a nano-sized line. In an embodiment, for example, the nano-sized line may have a width smaller than about 1000 nanometers (nm). In an embodiment of forming the pattern P, the pattern P may be formed through an etching process.

The unit wafer 10-1 may include one or more alignment marks M defined thereon or therein. When a plurality of unit wafers are coupled to each other, alignment marks M of the unit wafers may be used as reference during coupling thereof, for reducing mismatching of the unit wafers. The alignment marks M may be disposed in regions of the unit wafer 10-1 in which the pattern P is not disposed.

The unit wafer 10-1 may have an overall circular planar shape. In an embodiment, for example, a region of the unit wafer 10-1 in which the pattern P is disposed may have a substantially rectangular shape, but the invention is not limited thereto. A portion of the region in which the pattern P is not disposed may be removed to expose the region in which the pattern P is disposed. The unit wafer 10-1 from which is removed the portion of the region in which the pattern P is not disposed, may be coupled to another similarly structured unit wafer 10-1. That is, the unit wafer 10-1 from which is removed the portion of the region in which the pattern P is not disposed, includes the region in which the pattern P is disposed and a remaining portion of the region in which the pattern P is not disposed. The pattern P may be disposed in the above-described rectangular region of the unit wafer 10-1 having the overall circular shape, and a plurality of alignment marks M may be disposed in peripheral regions of the unit wafer 10-1. In an embodiment of manufacturing the unit wafer 10-1, the alignment marks M may be formed together with the pattern P, such as in a same process and/or including a same material.

Figure 2:
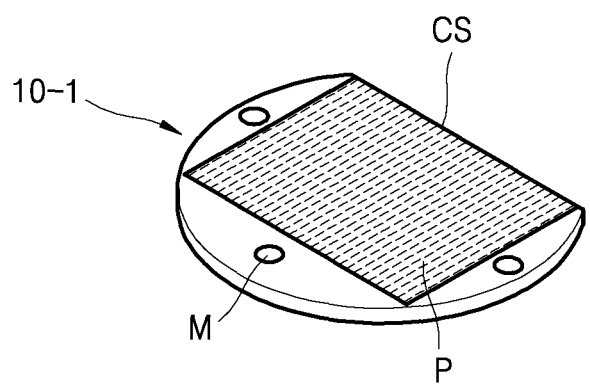
FIG. 2 is a perspective view illustrating removing a portion of the unit wafer of FIG. 1 to form a coupling surface thereon, according to an embodiment.

Referring to FIG. 2, the overall circular shape unit wafer 10-1 may be cut to remove a portion of the region in which the pattern P is not disposed and to form a coupling surface CS thereon. The coupling surface CS of a first unit wafer 10-1 may be a surface at which and to which a second unit wafer 10-1 is coupled. The unit wafer 10-1 may have at least one coupling surface CS.

Figure 3:
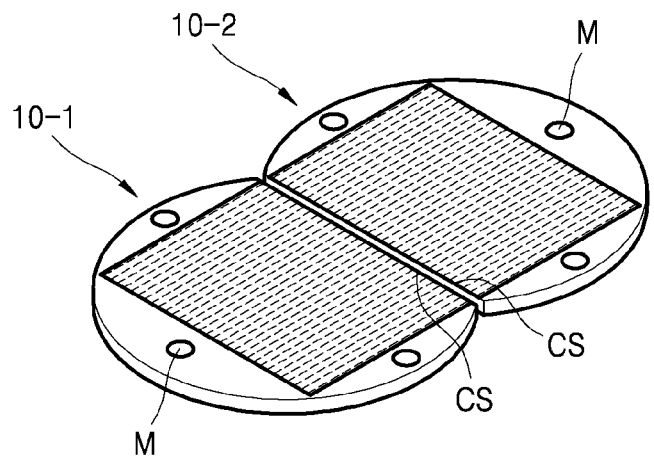
FIGS. 3 to 5 are each perspective views illustrating coupling two unit wafers to each other according to embodiments.

Referring to FIG. 3, two unit wafers 10-1 and 10-2 may be prepared. One of the two unit wafers will be referred to as a first unit wafer 10-1, and the other will be referred to as a second unit wafer 10-2. The first unit wafer 10-1 and the second unit wafer 10-2 may be prepared as described with respect to FIG. 2. In an embodiment of manufacturing a relatively large planar size master wafer, a first coupling surface CS of the individual first unit wafer 10-1 and a first coupling surface CS of the individual second unit wafer 10-2 may be oriented to face each other and may be moved towards each other. When the first unit wafer 10-1 and the second unit wafer 10-2 are moved to approach each other, the alignment marks M may be used for precise alignment of the two unit wafers.

Figure 4:
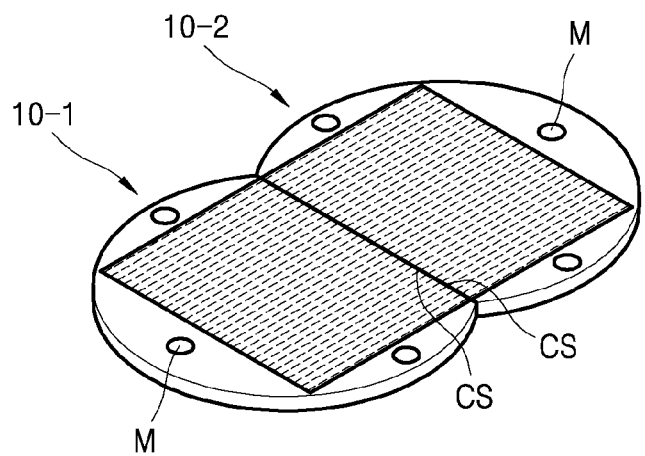

As shown in FIG. 4, by moving the first unit wafer 10-1 and the second unit wafer 10-2 toward each other, the first unit wafer 10-1 and the second unit wafer 10-2 may be bonded to each other such as using a coupling part provided between the first coupling surfaces CS of the two unit wafers. The coupling part may be an adhesive, but the invention is not limited thereto. This will be described later in more detail. Alternatively, the first unit wafer 10-1 and the second unit wafer 10-2 may be coupled to each other by a chemical bond without using an adhesive member or layer.

Figure 5:
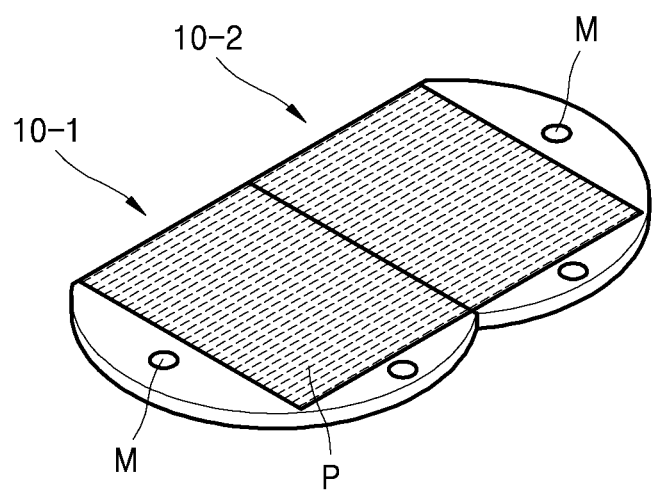

Referring to FIG. 5, after the first unit wafer 10-1 and the second unit wafer 10-2 are coupled, a portion of the first unit wafer 10-1 and the second unit wafer 10-2 may be removed such as by cutting, to form second coupling surfaces CS of the two unit wafers for coupling with other unit wafers. The second coupling surfaces CS are at different sides of the two unit wafers than the first coupling surfaces CS. The second coupling surfaces CS of individual wafer units may collectively form a continuous second coupling surface CS in a single plane, as illustrated in FIG. 5.

In an embodiment of manufacturing a relatively large planar size master wafer, all coupling surfaces of a unit wafer may be formed before joining unit wafers to each other, such as by performing a cutting process once on the unit wafer. However, in forming all coupling surfaces of a unit wafer before joining unit wafers to each other, alignment marks are also removed. Therefore, to utilize the alignment marks of the unit wafer, a portion of the unit wafer may be removed to form a coupling surface such as at each time a coupling surface is necessary to join the unit wafer with another unit wafer.

In an embodiment, for example, wafer cutting may be performed by one of a deep reactive ion etching method, a stealth dicing method and a wet etching method, but the invention is not limited thereto.

The deep reactive ion etching method may include a BOSCH process or a modified BOSCH process. In an embodiment, for example, an etched surface (e.g., a cut surface) having an angle in cross-section of about 90° and a relatively very low degree of roughness may be formed by the deep reactive ion etching method. If cut surfaces of two unit wafers have the relatively low degree of roughness, the unit wafers may be coupled without interfacial errors. In an embodiment, for example, a coupling surface of a unit wafer may have a roughness of about 5 µm or less. In an embodiment, for example, a coupling surface CS of a unit wafer may have a roughness of several hundreds of nm or less, several tens of nm, or less. In an embodiment, for example, a coupling surface of a unit wafer may have a roughness of about 400 nm or less. In an embodiment, for example, a coupling surface of a unit wafer may have a roughness of about 200 nm or less.

If the depth of a cut surface is reduced, the roughness of a cut surface may be reduced. That is, as the cross-sectional thickness of a wafer is increased, the roughness of a cut surface may increase in proportion to a cutting depth. Therefore, a relatively thin wafer may be used to reduce the cutting depth.

If two or more unit wafers have different cross-sectional thicknesses, a thickness deviation may be caused when the unit wafers are coupled. Where there is a difference in thicknesses of unit wafers to be coupled to each other, a portion of a rear surface (e.g., non-patterned surfaces) of one or more of the unit wafers may be removed such as through polishing to reduce the thickness difference therebetween.

The stealth dicing method may include a process in which a relatively high-energy laser beam is directed to a unit wafer to momentarily melt silicon crystals by heat. A laser beam may be directed to a rear surface (e.g., non-patterned surface) of a unit wafer and then to a position close to a patterned region of the unit wafer. The application of a laser beam may be repeatedly performed at regular intervals to form a preliminary cut surface. Then, a force may be applied to the preliminary cut surface to separate portions of the unit wafer from each other.

To separate portions of the unit wafer from each other at the preliminary cut surface, adhesive members such as pieces of adhesive tape may be attached to both sides of the preliminary cut surface, and the pieces of adhesive tape may be uniformly pulled out from both sides (e.g., away from each other). In the stealth dicing method, the preliminary cut surface to which a laser beam is directed may be deformed due to heat. However, an upper portion of the unit wafer on which a pattern is formed may have a cut surface having a low degree of roughness. The cut surface of the unit wafer may be used as a coupling surface when the unit wafer is coupled to another unit wafer.

In an embodiment of manufacturing a relatively large planar size master wafer, coupling surfaces of a plurality of unit wafers, formed as described above, may be directed to face each other, and then the facing unit wafers may be coupled to each other, so as to form a relatively large planar area master wafer. Such a process for coupling a plurality of unit wafers may be referred to as "a tiling process."

Figure 6:
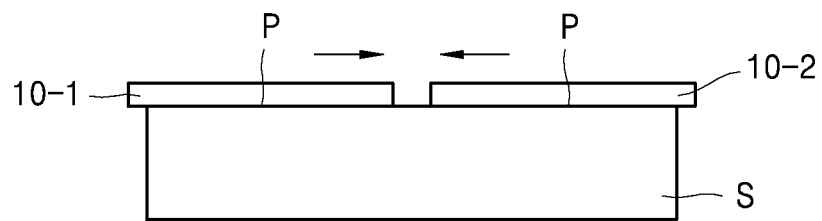
FIG. 6 is a cross-sectional view illustrating an operation of moving unit wafers for forming a large area master wafer toward each other according to an embodiment.

FIG. 6 is a cross-sectional view illustrating an operation of moving unit wafers for forming a relatively large area master wafer toward each other according to an embodiment.

Referring to the embodiment illustrated in FIG. 6, the first unit wafer 10-1 and the second unit wafer 10-2 are placed on a stage S, and then the first unit wafer 10-1 and the second unit wafer 10-2 are moved relative to each other to cause the unit wafers to approach each other (indicated by the arrows). In an embodiment of manufacturing a relatively large planar size master wafer, as shown in FIG. 6, the first unit wafer 10-1 and the second unit wafer 10-2 may be placed on the stage S such that patterned surfaces (indicated by "P") of the first unit wafer 10-1 and the second unit wafer 10-2 face an upward surface of the stage S. Before the first unit wafer 10-1 and the second unit wafer 10-2 are placed on the stage S, the first unit wafer 10-1 and the second unit wafer 10-2 may be polished to reduce a thickness difference therebetween Thereafter, the first unit wafer 10-1 and the second unit wafer 10-2 may be caused to approach each other and coupled to each other. A unit wafer coupling process will be described later in detail.

Figure 7:
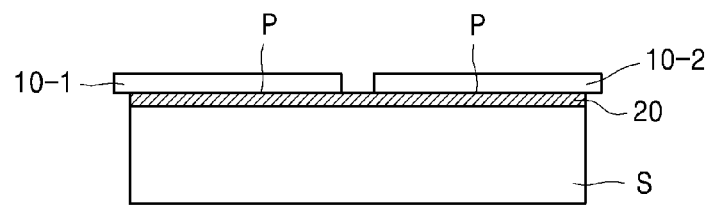
FIG. 7 is a cross-sectional view illustrating orienting patterns of the unit wafers to face stages according to an embodiment.

FIG. 7 is a cross-sectional view illustrating orienting patterns of the unit wafers to face stages according to an embodiment.

Referring to FIG. 7, in an embodiment of manufacturing a relatively large planar size master wafer, the first unit wafer 10-1 and the second unit wafer 10-2 may be placed on the stage S with the patterned surfaces of the first unit wafer 10-1 and the second unit wafer 10-2 facing the stage S. The patterned surfaces of the first unit wafer 10-1 and the second unit wafer 10-2 may be oriented to each face the stage S before an operation of moving unit wafers for forming a relatively large area master wafer toward each other. With the patterned surfaces of the first unit wafer 10-1 and the second unit wafer 10-2 facing the stage, one or both of the first unit wafer 10-1 and the second unit wafer 10-2 may be moved relative to each other so that the first unit wafer 10-1 and the second unit wafer 10-2 may approach each other to reduce a distance therebetwen.

When the first unit wafer 10-1 or the second unit wafer 10-2 having the patterned surface facing the stage is moved, the pattern P at the patterned surface thereof may be scratched. Therefore, a coating layer 20 may be disposed between the stage S and the patterned surfaces of the first and second unit wafers 10-1 and 10-2. In an embodiment, for example, the coating layer 20 may include a material having a low surface energy such as a synthetic resin made from polymerized tetrafluoroethylene (e.g., Teflon®).

As shown in FIG. 7, when the first and second unit wafers 10-1 and 10-2 are placed on the stage S with the patterns P thereof facing the stage S, the patterns P are disposed on a same plane. Since the patterns P are disposed on a same plane, the patterns P may be uniformly connected even though the first and second unit wafers 10-1 and 10-2 have different cross-sectional thicknesses. Therefore, a polishing process for reducing a thickness deviation of unit wafers may be omitted.

Figure 8:
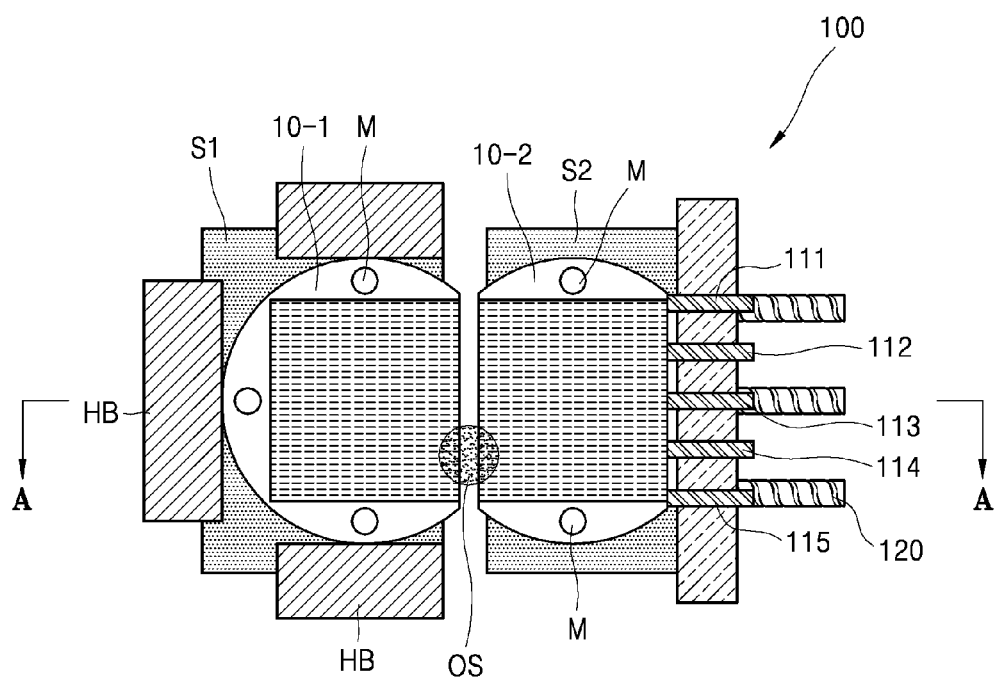
FIG. 8 is a plan view illustrating a device for manufacturing a relatively large planar area master wafer according to an embodiment.
Figure 9:
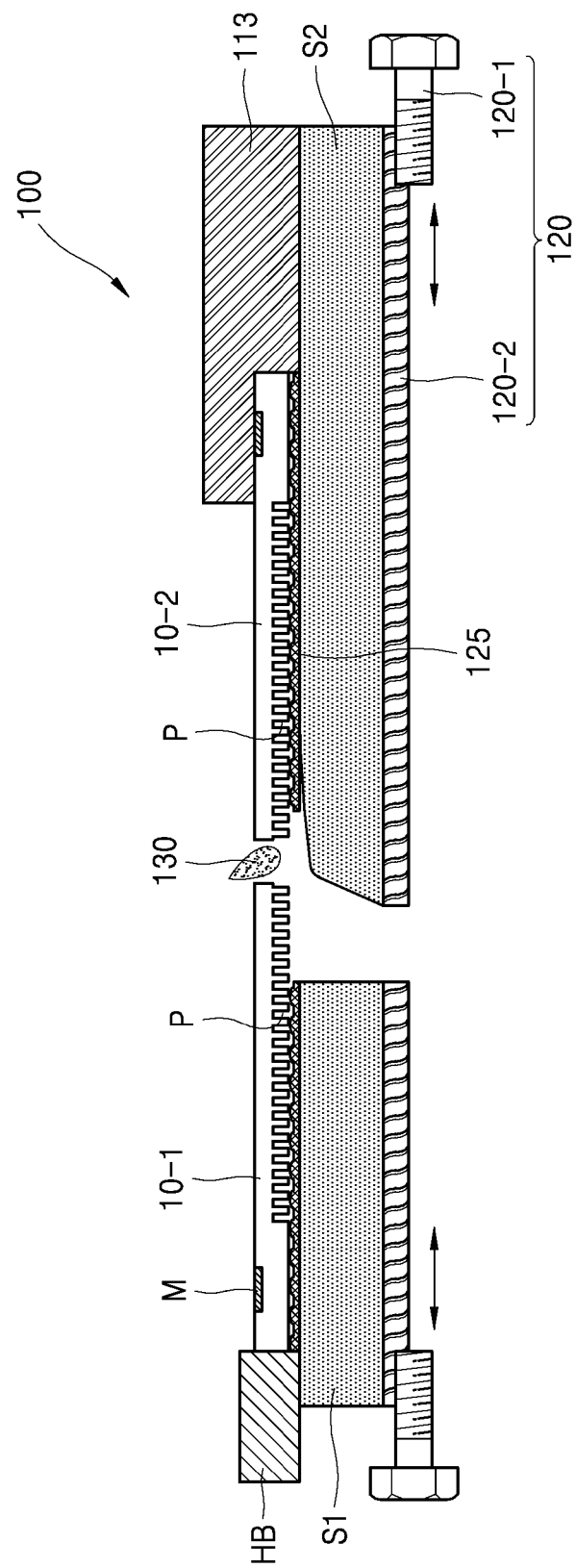
FIG. 9 is a cross-sectional view taken along line A-A of FIG. 8.

FIG. 8 is a schematic plan view illustrating a unit wafer moving device 100 used to cause unit wafers to approach each other. FIG. 9 is a cross-sectional view taken along line A-A of FIG. 8.

Referring to FIGS. 8 and 9, the unit wafer moving device 100 may include a first stage S1 on which is placed the first unit wafer 10-1 and a second stage S2 on which the second unit wafer 10-2 is placed. One or more holding blocks BH may be used to fix the first unit wafer 10-1 to an upper surface of the first stage S1. In an embodiment, for example, three holding blocks HB may be used, but the invention is not limited thereto.

The second stage S2 may include a driving unit configured to move the second unit wafer 10-2. In an embodiment, for example, the driving unit may include piezoelectric actuators. However, the driving unit is not limited thereto. That is, the driving unit may include any of a number of other actuators capable of moving a unit wafer in a micro-manner (e.g., at micro distances or intervals, such as those smaller than about 1000 µm). In an embodiment, for example, the piezoelectric actuators may include first to fifth piezoelectric actuators 111, 112, 113, 114 and 115. The number of the piezoelectric actuators may be determined according to a control method for moving the second unit wafer 10-2. The first to fifth piezoelectric actuators 111, 112, 113, 114 and 115 may be used to linearly move and/or to tilt the second unit wafer 10-2. In an embodiment, for example, if the first to fifth piezoelectric actuators 111, 112, 113, 114 and 115 are operated together, the second unit wafer 10-2 may be linearly moved in a plane in which the second unit wafer 10-2 is disposed. In an embodiment, for example, if the first and second piezoelectric actuators 111 and 112 are operated but the third to fifth piezoelectric actuators 113, 114 and 115 are not operated, the second unit wafer 10-2 may be rotated counterclockwise in the plan view of FIG. 8, within the plane in which the second unit wafer 10-2 is disposed, to be tilted from an initial non-tilted position thereof. As described above, the first to fifth piezoelectric actuators 111, 112, 113, 114 and 115 may be selectively operated to be turned on and off for precise control of the movement of the second unit wafer 10-2.

A first coating layer 125 may be disposed between the first stage S1 and the pattern P of first unit wafer 10-1, and a second coating layer 125 separate from the first coating layer 125 may be disposed between the second stage S2 and the pattern P of the second unit wafer 10-2, so as to prevent scratches to the patterns P. In an embodiment, for example, the coating layers 125 may include a material having low surface energy such as a polymerized tetrafluoroethylene (e.g., Teflon®). Since the coating layers 125 have a relatively low degree of surface roughness, when the first unit wafer 10-1 and the second unit wafer 10-2 are moved with respect to the coating layers 125, scratches to the patterns P and/or remaining portions of the unit wafers caused by surface friction may be decreased or effectively prevented.

The movement of the second unit wafer 10-2 may be controlled in a micro-manner by using the alignment marks M of the first and second unit wafers 10-1 and 10-2.

In the above description, only the second unit wafer 10-2 is moved in a micro-manner. However, the invention is not limited thereto. In an embodiment, for example, another driving unit may be used to move the first unit wafer 10-1 in a micro-manner, similar to the above-described manner in which the second unit wafer 10-2 is moved.

An optical sensor OS may be used to detect a distance between the first and second unit wafers 10-1 and 10-2 when the first unit wafer 10-1 and/or the second unit wafer 10-2 is moved in a micro-manner. The optical sensor OS may be disposed overlapping (e.g., above and/or below) a gap defined between the first unit wafer 10-1 and the second unit wafer 10-2. The optical sensor OS may detect the distance between the first and second unit wafers 10-1 and 10-2. The detected distance by the optical sensor OS may be used in cooperation with a control member such a computer, processor, etc., or may be used alone to control movement of the first and/or second unit wafers 10-1 and 10-2. In an embodiment, for example, if the distance between the first and second unit wafers 10-1 and 10-2 reaches a predetermined value, movement of the first and/or second unit wafers 10-1 and 10-2 may be stopped.

In addition, a macro-driving unit 120 may be used to move one or more of the first stage S1 and the second stage S2 to reduce the distance between the first and second unit wafers 10-1 and 10-2 separate from movement of the first unit wafer 10-1 and/or the second unit wafer 10-2. The macro-driving unit 120 may include any of a number of devices configured to move a unit wafer in a macro-manner (e.g., at micro distances or intervals, such as those greater than about 1000 µm).

In an embodiment, for example, the macro-driving unit 120 may include a roll screw 120-1 and a screw bar 120-2 provided on each of the first and second stages S1 and S2. However, the roll screw 120-1 and the screw bar 120-2 are just examples. That is, various driving mechanisms or methods may be used to move the first and second stages S1 and S2.

After the first and second unit wafers 10-1 and 10-2 are moved to approach each other in a macro-manner and/or a micro-manner as described above, a coupling part 130 may be disposed between the first and second unit wafers 10-1 and 10-2. The coupling part 130 may be an adhesive. In an embodiment, for example, the adhesive may include a photocurable resin or a thermosetting resin. The first and second unit wafers 10-1 and 10-2 may be coupled to each other by hardening the material for forming the coupling part 130, to form the coupling part 130. As the coupling part 130 is filled in the gap between the coupling surfaces CS of the first and second unit wafers 10-1 and 10-2, the first and second unit wafers 10-1 and 10-2 may be coupled to each other. Even where the gap is uneven (e.g., non-uniform distance between the first and second unit wafers 10-1 and 10-2), the first and second unit wafers 10-1 and 10-2 may be coupled to each other via the coupling part 130 filled in such uneven gap.

Figure 10:
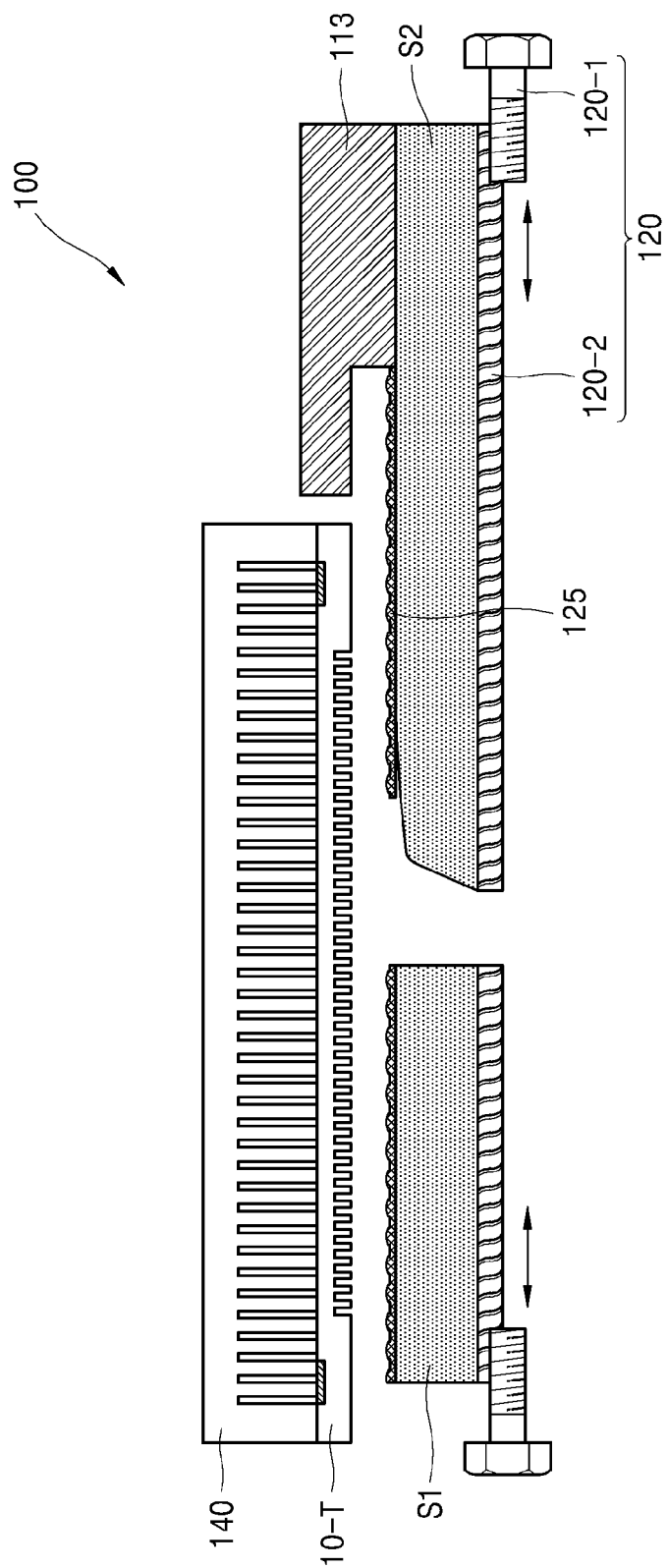
FIG. 10 is a cross-sectional view illustrating separation of a relatively large planar area master wafer from a plurality of stages according to an embodiment.

FIG. 10 is a cross-sectional view illustrating separation of a relatively large planar area master wafer from a plurality of stages according to an embodiment.

The first and second unit wafers 10-1 and 10-2 coupled to each other may collectively form a master wafer 10-T. In the description above, two unit wafers are coupled to each other. However, more than two unit wafers may be coupled in the same manner as described above to form a master wafer 10-T. For convenience of illustration, the coupling part 130 is not explicitly shown in FIG. 10, but is disposed between adjacent unit wafers coupled to each other. The master wafer 10-T includes a pattern corresponding to the patterns of the coupled unit wafers 10-1 and 10-2.

A separating unit 140 may be used to separate the master wafer 10-T from the first and second stages S1 and S2. In an embodiment, for example, the separating unit 140 may include a vacuum chuck.

A tiling method for three or more unit wafers will now be described according to an embodiment. FIGS. 11 to 16 are perspective views illustrating a method of manufacturing a relatively large planar area master wafer according to an embodiment.

Figure 11:
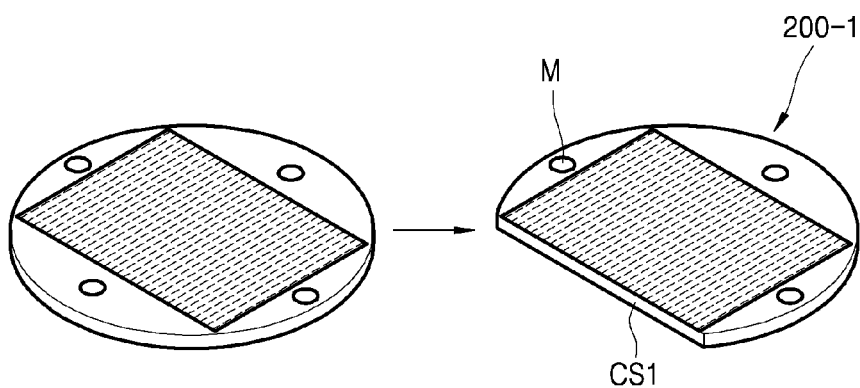
FIGS. 11 to 16 are perspective views illustrating a method of manufacturing a relatively large planar area master wafer according to an embodiment.

Referring to FIG. 11, a portion of a first unit wafer 200-1 may be removed to form a first coupling surface CS1 of the first unit wafer 200-1. The first unit wafer 200-1 may include one or more alignment marks M.

Figure 12:
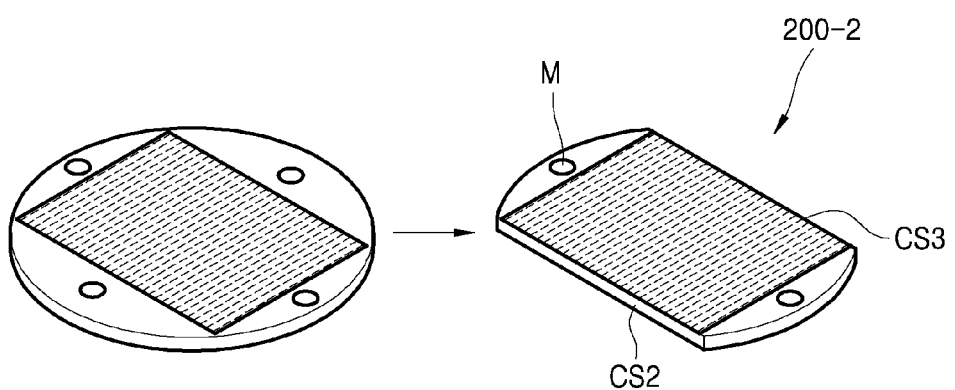

Referring to FIG. 12, a portion of a second unit wafer 200-2 may be removed to form a second coupling surface CS2 and a third coupling surface CS3 of the second unit wafer 200-2.

Figure 13:
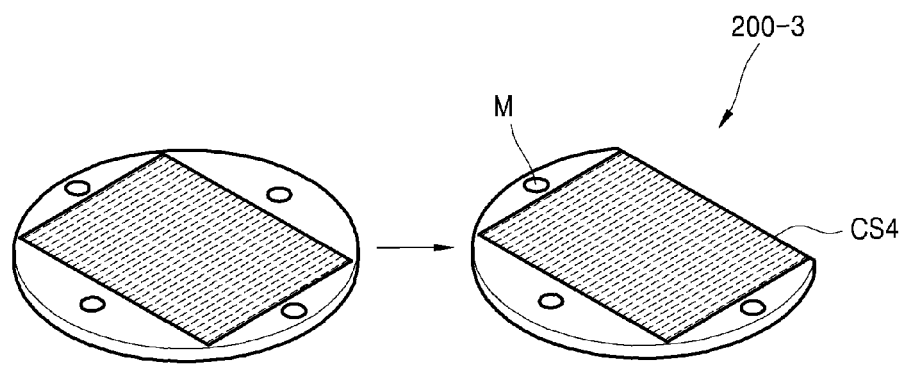

Referring to FIG. 13, a portion of a third unit wafer 200-3 may be removed to form a fourth coupling surface CS4 of the third unit wafer 200-3.

Portions of the first to third unit wafers 200-1, 200-2 and 200-3 are removed in the same manner as described above, and thus a description thereof will not be repeated.

The first to third unit wafers 200-1, 200-2 and 200-3 with coupling surfaces defined thereon, may be combined in various manners to form a master wafer. In an embodiment, for example, when unit wafers are combined into an 1×7 array, a first unit wafer 200-1 including the first coupling surface CS1 and a first second unit wafer 200-2 including the second and third coupling surfaces CS2 and CS3 may be coupled to each other, and four more second unit wafers 200-2 including the second and third coupling surfaces CS2 and CS3 may be coupled to the first second unit wafer 200-2. Then, a third unit wafer 200-3 including the fourth coupling surface CS4 may be coupled to the last one of the more second unit wafers 200-2.

If the number of alignment marks remaining on a unit wafer from which a portion thereof is removed is relatively large when unit wafers are coupled, nano-sized patterns of the unit wafers may be precisely matched. When unit wafers are coupled, the unit wafers may be arranged in various states of remaining alignment marks. In an embodiment, for example, unit wafers may be coupled in a state in which at least two alignment marks remain on each of the unit wafers.

Figure 14:
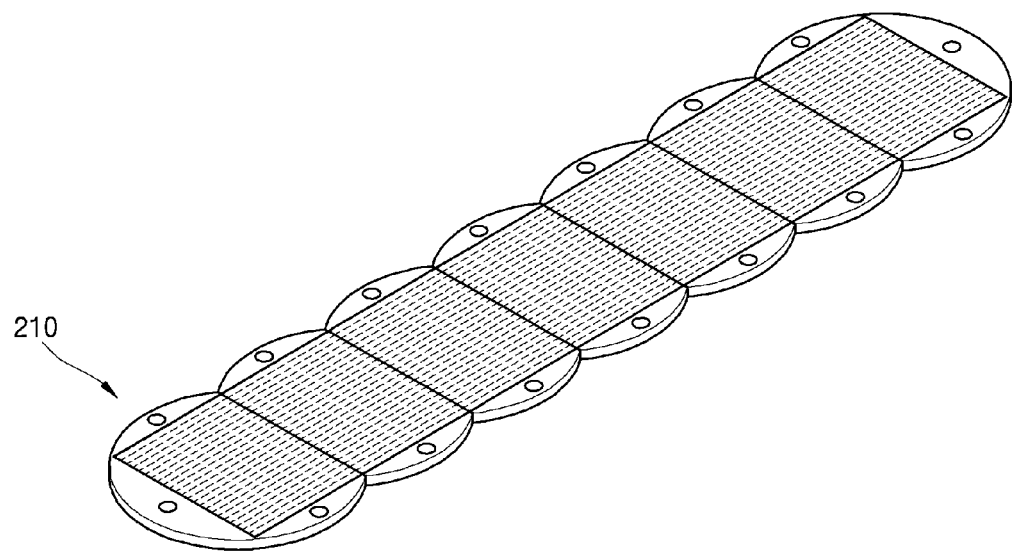
Figure 15:
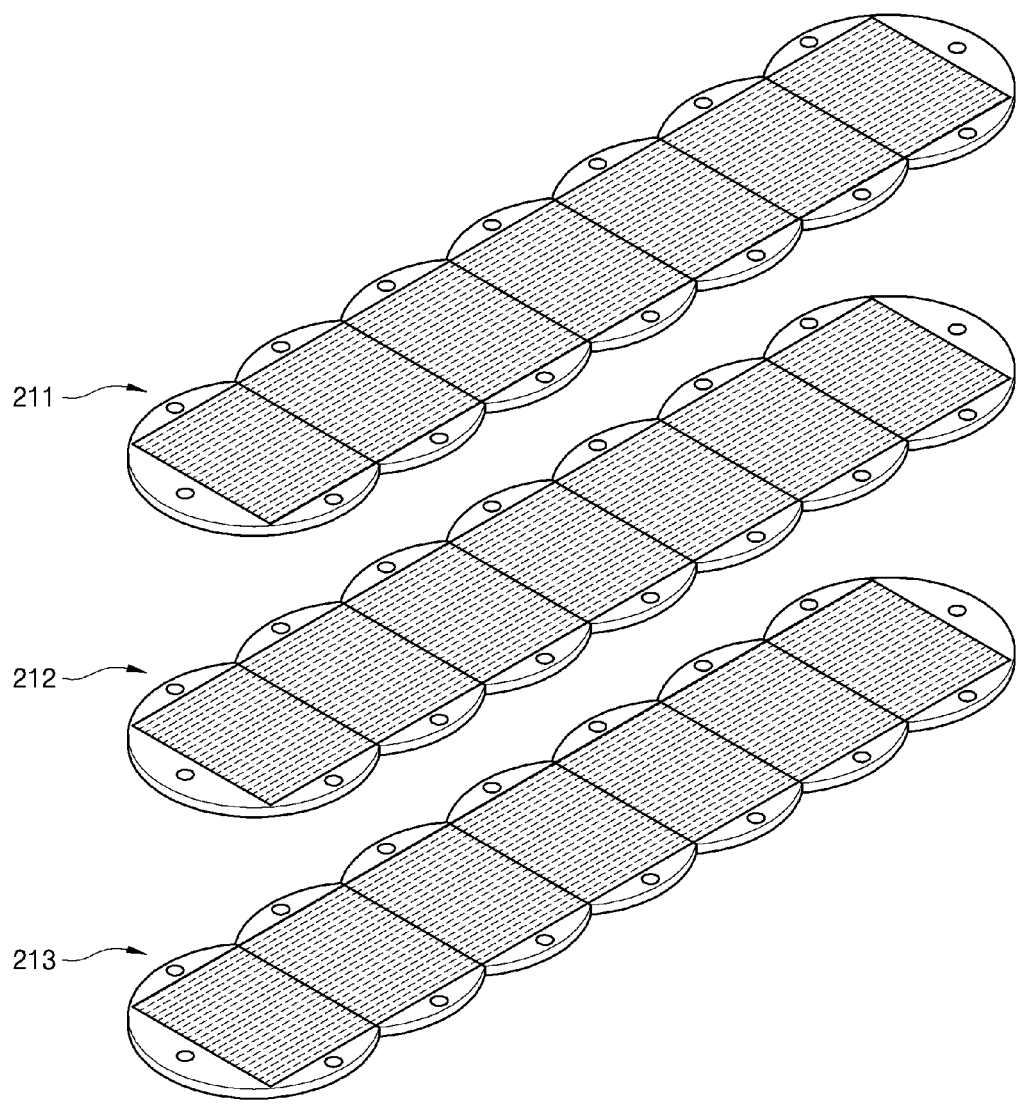

FIG. 14 illustrates a master wafer 210 formed by combining unit wafers 200-1, 200-2 and 200-3 into a 1×7 array. Portions of the master wafer 210 including the array of unit wafers 200-1, 200-2 and 200-3 on which alignment marks remain, may be removed, to finally form the master wafer 210.

In an embodiment, for example, when a master wafer having a 3×7 array of unit wafers is manufactured (refer to FIG. 15), a first intermediate master wafer 211 having a 1×7 array, a second intermediate master wafer 212 having a 1×7 array, and a third intermediate master wafer 213 having a 1×7 array may be manufactured as described with reference to FIGS. 11 to 14. Thereafter, an elongated peripheral portion extended along a length of the first intermediate master wafer 211 is removed from a side of the first intermediate master wafer 211 adjacent to the second intermediate master wafer 212. Elongated peripheral portions extended along a length of the second intermediate master wafer 212 are removed from both of opposing long sides of the second intermediate master wafer 212. An elongated peripheral portion extended along a length of the third intermediate master wafer 213 is removed a side of the third intermediate master wafer 213 adjacent to the second intermediate master wafer 212. Respective coupling surfaces are defined at the sides of the intermediated wafers at which portions thereof are removed.

Figure 16:
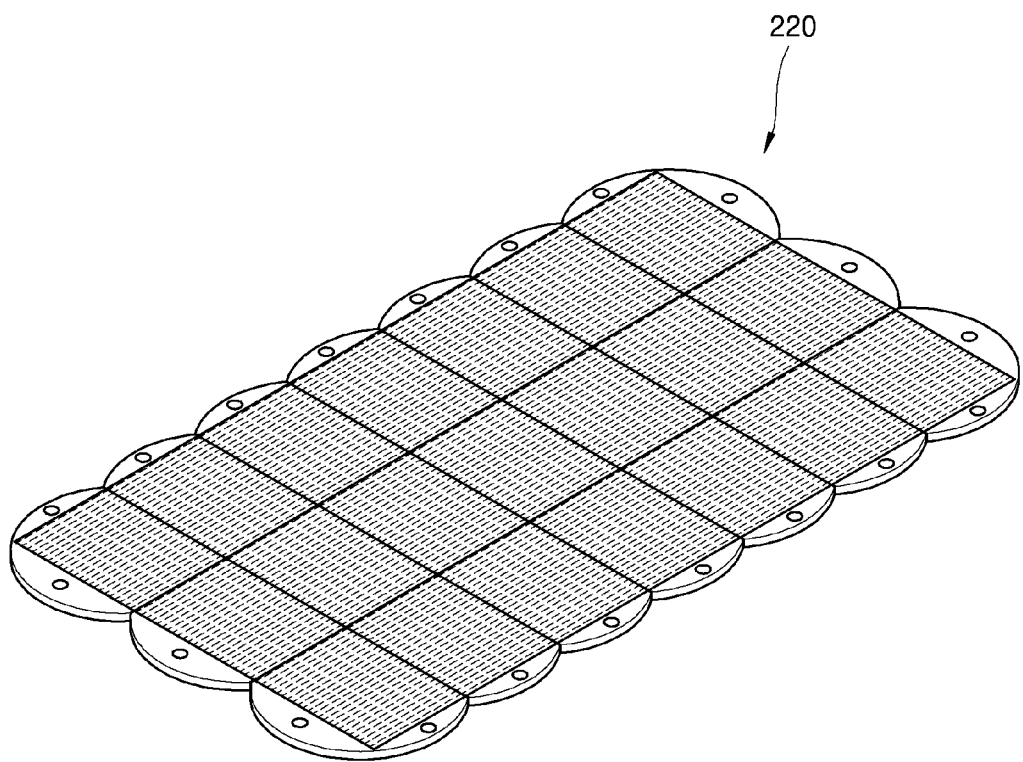

Referring to FIG. 16, coupling surfaces of the first to third intermediate master wafers 211, 212 and 213 formed after removing the peripheral portions thereof are oriented to face each other, and then the first to third intermediate master wafers 211, 212 and 213 are coupled to each other. The first to third intermediate master wafers 211, 212 and 213 may be coupled by the same method as that described with reference to FIGS. 8 to 10. In this manner, the first to third intermediate master wafers 211, 212 and 213 from which portions thereof are removed, may be coupled to each other to form a master wafer 220 having a pattern corresponding to the patterns of the first to third intermediate master wafers 211, 212 and 213.

Portions of the master wafer 220 on which alignment marks remain may be finally removed. As described above, a master wafer having a relatively large planar area may be manufactured by the tiling method according to an embodiment.

Master wafers manufactured according to one or more embodiment may be used to manufacture relatively large planar area optical devices and/or semiconductor components at a relatively high process yield. In an embodiment of manufacturing an optical device and/or semiconductor component, relatively large planar area patterns having a nano-sized line width may be formed on a master wafer such as by a nano-implanting method. An optical device having repeating patterns may be manufactured using a relatively large planar area master wafer according to an embodiment.

An optical device such as a wire grid polarizer may be manufactured according to one or more embodiment described above. A relatively large planar area wire grid polarizer may be manufactured using a master wafer according to one or more embodiment described above. In an embodiment, for example, the relatively large planar area wire grid polarizer may be used in a liquid crystal display.

FIGS. 17 to 22 are cross-sectional views illustrating a method of manufacturing an optical device by using a relatively large planar area master wafer according to an embodiment.

Figure 17:
FIGS. 17 to 22 are cross-sectional views illustrating a method of manufacturing an optical device by using a relatively large planar area master wafer according to an embodiment.

Referring to FIG. 17, a master wafer 300 may be prepared to include a pattern P, and a first resin layer 305 may be formed on the master wafer 300 including the pattern P corresponding to the patterns of the coupled unit wafers. The master wafer 300 may be manufactured by one or more embodiment of the methods described with reference to FIGS. 1 to 16. The pattern P may have a micro-sized or nano-sized line width.

Figure 18:
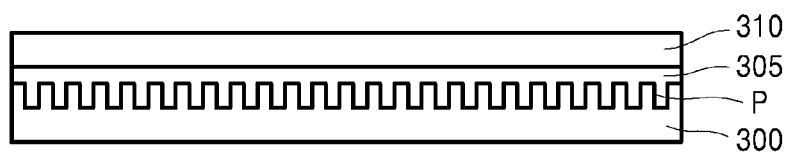

Referring to FIG. 18, a stamp film 310 may be disposed on the first resin layer 305 disposed on the master wafer 300 including the pattern P. The pattern P of the master wafer 300 may be transferred to the first resin layer 305 to form a first pattern P1 of the first resin layer 305. The first pattern P1 corresponds to the master wafer 300 pattern P.

Figure 19:
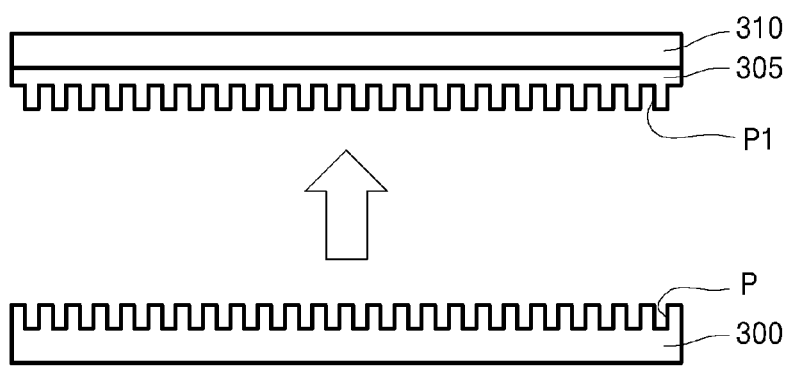

Referring to FIG. 19, the first resin layer 305 including the first pattern P1 and the stamp film 310 may be separated from the master wafer 300 including the pattern P.

Figure 20:
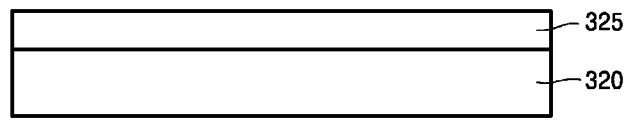
Figure 21:
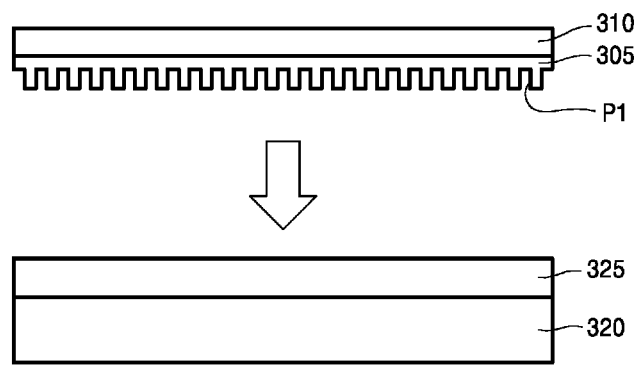
Figure 22:
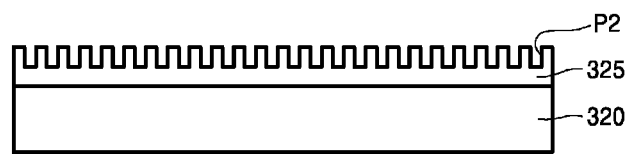

Referring to FIG. 20, a second resin layer 325 may be disposed on a substrate 320. Referring to FIG. 21, the stamp film 310 including the first resin layer 305 with the first pattern P1 thereon may be placed on and/or contacted with the second resin layer 325 to transfer the first pattern P1 to the second resin layer 325 and form a second pattern P2 of the second resin layer 325. Thereafter, the stamp film 310 including the first resin layer 305 with the first pattern P1 thereon may be separated from the substrate 320 including the second resin layer 325 with the second pattern P2 thereon. As a result, the second pattern P2 may be formed on and remain defined in the second resin layer 325. The second pattern P2 may be the same as the pattern P of the master wafer 300.

In the above-described manner, the stamp film 310 including the first resin layer 305 with the first pattern P1 thereon may be repeatedly used to manufacture a relatively large planar area optical device such as a relatively large planar area grid wire polarizer.

Embodiments of the relatively large planar area master wafer, the method of manufacturing the relatively large planar area master wafer, and the method of manufacturing an optical device by using the relatively large planar area master wafer have been described with reference to the accompanying drawings for illustrative purposes only. It is understood by those of ordinary skill in the art that various changes and other equivalent embodiments may be made therefrom. Therefore, the scope and spirit of the invention should be defined by the following claims.

What is claimed is:

1. A method of manufacturing a master wafer, the method comprising:
   providing a pattern respectively on a plurality of unit wafers;
   removing from each of the plurality of unit wafers on which the pattern is provided, a portion thereof excluding the pattern, to form a coupling surface of each of the unit wafers on which the pattern is provided;
   aligning the unit wafers for which is formed the coupling surface, such that the coupling surfaces of the unit wafers face each other; and
   coupling the unit wafers for which the coupling surfaces face each other, to each other at the facing coupling surfaces.

2. The method of claim 1, further comprising disposing at least one alignment mark on each of the unit wafers on which the pattern is provided.

3. The method of claim 1, wherein the removing the unit wafer portion excluding the pattern comprises a deep reactive ion etching method, a stealth dicing method or a wet etching method.

4. The method of claim 3, wherein the deep reactive ion etching method comprises a BOSCH method.

5. The method of claim 1, wherein each of the coupling surfaces have a roughness of about 5 micrometers or less.

6. The method of claim 1, wherein the coupling the unit wafers comprises:
   reducing a distance between facing coupling surfaces of adjacent unit wafers;
   disposing a photocurable resin or a thermosetting resin between the facing coupling surfaces of the adjacent unit wafers; and
   hardening the photocurable resin or the thermosetting resin between the facing coupling surfaces of the adjacent unit wafers.

7. The method of claim 1, wherein the aligning the unit wafers comprises, within a plane in which the unit wafers are disposed, linearly moving or tilting the unit wafers by using an actuator.

8. The method of claim 7, wherein the actuator comprises a plurality of piezoelectric actuators.

9. The method of claim 1, wherein the aligning the unit wafers comprises:
   disposing coating layers on a plurality of stages upon which the unit wafers to be aligned are disposed, the coating layers comprising a material having low surface energy; and
   respectively placing the unit wafers to be aligned, on the coating layers disposed on the plurality of stages, such that the patterns of the unit wafers to be aligned face the coating layers.

10. The method of claim 9, wherein the coating layers comprise polymerized tetrafluoroethylene.

11. The method of claim 1, further comprising polishing the unit wafers on which the pattern is provided to reduce a thickness difference therebetween.

12. The method of claim 2, further comprising disposing a plurality of alignment marks on each of the unit wafers on which the pattern is provided,
   wherein
   the removing the unit wafer portion excluding the pattern comprises leaving at least two alignment marks on each of the unit wafers on which the pattern is provided; and
   the aligning the unit wafers comprises aligning the least two alignment marks left on each of the unit wafers with each other.

13. A method of manufacturing an optical device, the method comprising:
   providing a pattern respectively on a plurality of unit wafers;
   removing from the plurality of unit wafers on which the pattern is provided, a portion thereof excluding the pattern, to form a coupling surface of each of the unit wafers on which the pattern is provided;
   aligning the unit wafers for which is formed the coupling surface, such that the coupling surfaces of the unit wafers face each other;
   coupling the unit wafers for which the coupling surfaces face each other, to each other at the facing coupling surfaces, to form a master wafer including a master wafer pattern corresponding to the patterns of the coupled unit wafers;
   disposing a first resin layer on the master wafer including the master wafer pattern;
   disposing a stamp film on the first resin layer disposed on the master wafer to transfer the master wafer pattern onto the first resin layer and form on the stamp film, a patterned first resin layer corresponding to the master wafer pattern;
   separating the stamp film and the patterned first resin layer thereon from the master wafer including the master wafer pattern;
   disposing a second resin layer on a substrate separate from the master wafer; and
   placing the stamp film and the patterned first resin layer thereon on the second resin layer disposed on the substrate, to transfer the patterns of the coupled unit wafers onto the second resin layer.

14. The method of claim 13, further comprising disposing at least one alignment mark on each of the unit wafers on which the pattern is provided.

15. The method of claim 13, wherein the removing the unit wafer portion excluding the pattern comprises a deep reactive ion etching method, a stealth dicing method or a wet etching method.

16. The method of claim 15, wherein the deep reactive ion etching method comprises a BOSCH method.

* * * * *